(12) United States Patent
Wu

(10) Patent No.: US 8,537,153 B2
(45) Date of Patent: Sep. 17, 2013

(54) SOURCE DRIVER HAVING MULTIPLEXERS POSITIONED BETWEEN DIFFERENTIAL AMPLIFIERS AND BUFFERS AND ASSOCIATED DRIVING METHOD

(75) Inventor: Jia-Hao Wu, Tainan County (TW)

(73) Assignee: Himax Technologies Limited, Xinshi Dist., Tainan (TW)

( * ) Notice: Subject to any disclaimer, the term of this patent is extended or adjusted under 35 U.S.C. 154(b) by 424 days.

(21) Appl. No.: 12/650,503

(22) Filed: Dec. 30, 2009

(65) Prior Publication Data

US 2011/0157150 A1 Jun. 30, 2011

(51) Int. Cl.
*G06F 3/038* (2013.01)
*G09G 5/00* (2006.01)

(52) U.S. Cl.
USPC .............................. 345/214; 345/96; 345/209

(58) Field of Classification Search
USPC .......................................... 345/96, 209, 214
See application file for complete search history.

(56) References Cited

U.S. PATENT DOCUMENTS

| | | | | |
|---|---|---|---|---|
| 5,920,210 A | * | 7/1999 | Kaplinsky | 327/112 |
| 6,266,038 B1 | * | 7/2001 | Yoshida et al. | 345/92 |
| 6,304,241 B1 | * | 10/2001 | Udo et al. | 345/96 |
| 2006/0171477 A1 | * | 8/2006 | Carballo et al. | 375/257 |

FOREIGN PATENT DOCUMENTS

| | | | |
|---|---|---|---|
| KR | 1020070104864 | * | 4/2009 |
| TW | 521252 | | 2/2003 |
| TW | 200620224 | | 6/2006 |
| TW | 200627354 | | 8/2006 |
| TW | 200627792 | | 8/2006 |
| TW | 200726073 | | 7/2007 |

* cited by examiner

*Primary Examiner* — Kwang-Su Yang
(74) *Attorney, Agent, or Firm* — Winston Hsu; Scott Margo

(57) ABSTRACT

A source driver includes a first differential amplifier, a first output stage, a second differential amplifier, a second output stage and a multiplexer. The first differential amplifier is utilized for receiving a first differential input signal pair to generate a first differential output signal pair. The second differential amplifier is utilized for receiving a second differential input signal pair to generate a second differential output signal pair. The multiplexer couples the first differential amplifier to the first output stage and couples the second differential amplifier to the second output stage under a first configuration, and couples the first differential amplifier to the second output stage and couples the second differential amplifier to the first output stage under a second configuration.

11 Claims, 4 Drawing Sheets

SOURCE DRIVER HAVING MULTIPLEXERS POSITIONED BETWEEN DIFFERENTIAL AMPLIFIERS AND BUFFERS AND ASSOCIATED DRIVING METHOD

BACKGROUND OF THE INVENTION

1. Field of the Invention

The present invention relates to a source driver, and more particularly, to a source driver which has better driving ability without increasing the chip area, and an associated driving method.

2. Description of the Prior Art

In a source driver of a thin film transistor liquid crystal display (TFT-LCD), a multiplexer is usually positioned after the output buffer of the source driver shown in FIG. 1 for providing high impedance and polarization inversion. FIG. 1 shows two output buffers 102, 104, and a multiplexer 106 of a source driver, where the output buffers 102, 104 have input nodes Nin_1, Nin_2, respectively, and the multiplexer 106 has two output nodes Nout_1 and Nout_2. In FIG. 1, the multiplexer 106 provides an equivalent resistor coupled between the output buffers 102, 104 and the output nodes Nout_1, Nout_2, and the driving ability of the source driver will be influenced. In addition, to prevent from decreasing the driving ability, the chip area of the multiplexer 106 needs to be increased to lower the equivalent resistance. This means the manufacturing cost of the source driver is increased.

SUMMARY OF THE INVENTION

It is therefore an objective of the present invention to provide a source driver and an associated driving method, the source driver having better driving ability without increasing the chip area, so as to solve the above-mentioned problems.

According to one embodiment of the present invention, a source driver comprises a first channel and a second channel, where the first channel comprises a first differential amplifier and a first output stage, and the second channel comprises a second differential amplifier and a second output stage. The first differential amplifier is utilized for receiving a first differential input signal pair to generate a first differential output signal pair. The second differential amplifier is utilized for receiving a second differential input signal pair to generate a second differential output signal pair. The multiplexer has a first input port coupled to the first differential amplifier for receiving the first differential output signal pair, a second input port coupled to the second differential amplifier for receiving the second differential output signal pair, a first output port coupled to the first output stage, and a second output port coupled to the second output stage, where the multiplexer couples the first input port to the first output port and couples the second input port to the second output port under a first configuration, and couples the first input port to the second output port and couples the second input port to the first output port under a second configuration.

According to another embodiment of the present invention, a driving method of a source driver comprises: receiving a first differential input signal pair to generate a first differential output signal pair; receiving a second differential input signal pair to generate a second differential output signal pair; and providing a multiplexer having a first input port for receiving the first differential output signal pair, a second input port for receiving the second differential output signal pair, a first output port coupled to a first output stage, and a second output port coupled to a second output stage, wherein the multiplexer couples the first input port to the first output port and couples the second input port to the second output port under a first configuration, and couples the first input port to the second output port and couples the second input port to the first output port under a second configuration.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
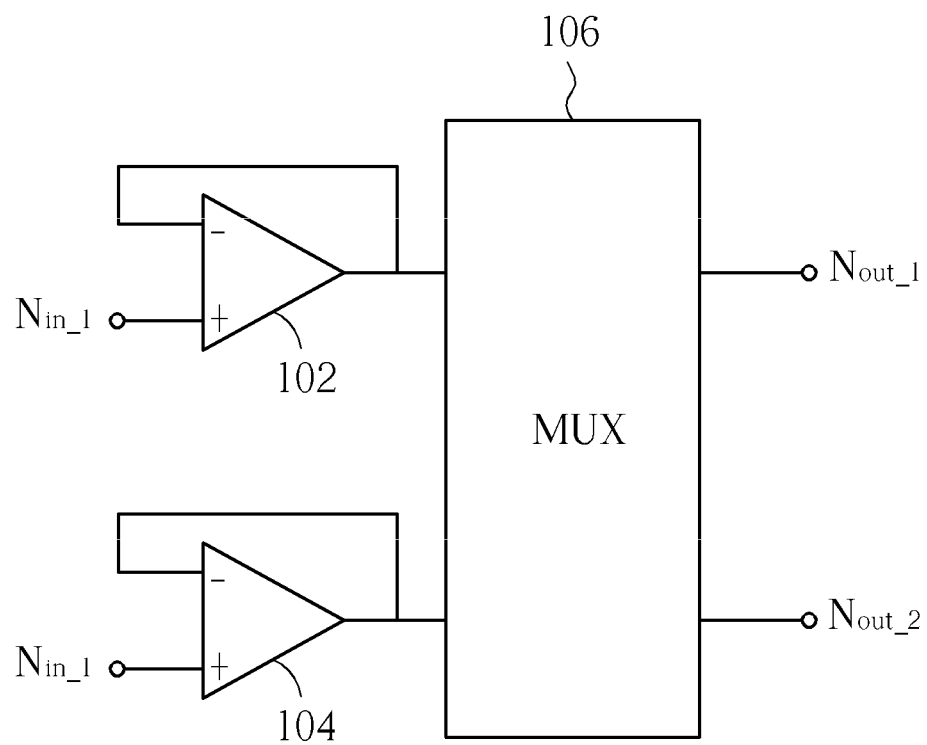
FIG. 1 is a diagram illustrating a prior art source driver.
Figure 2:
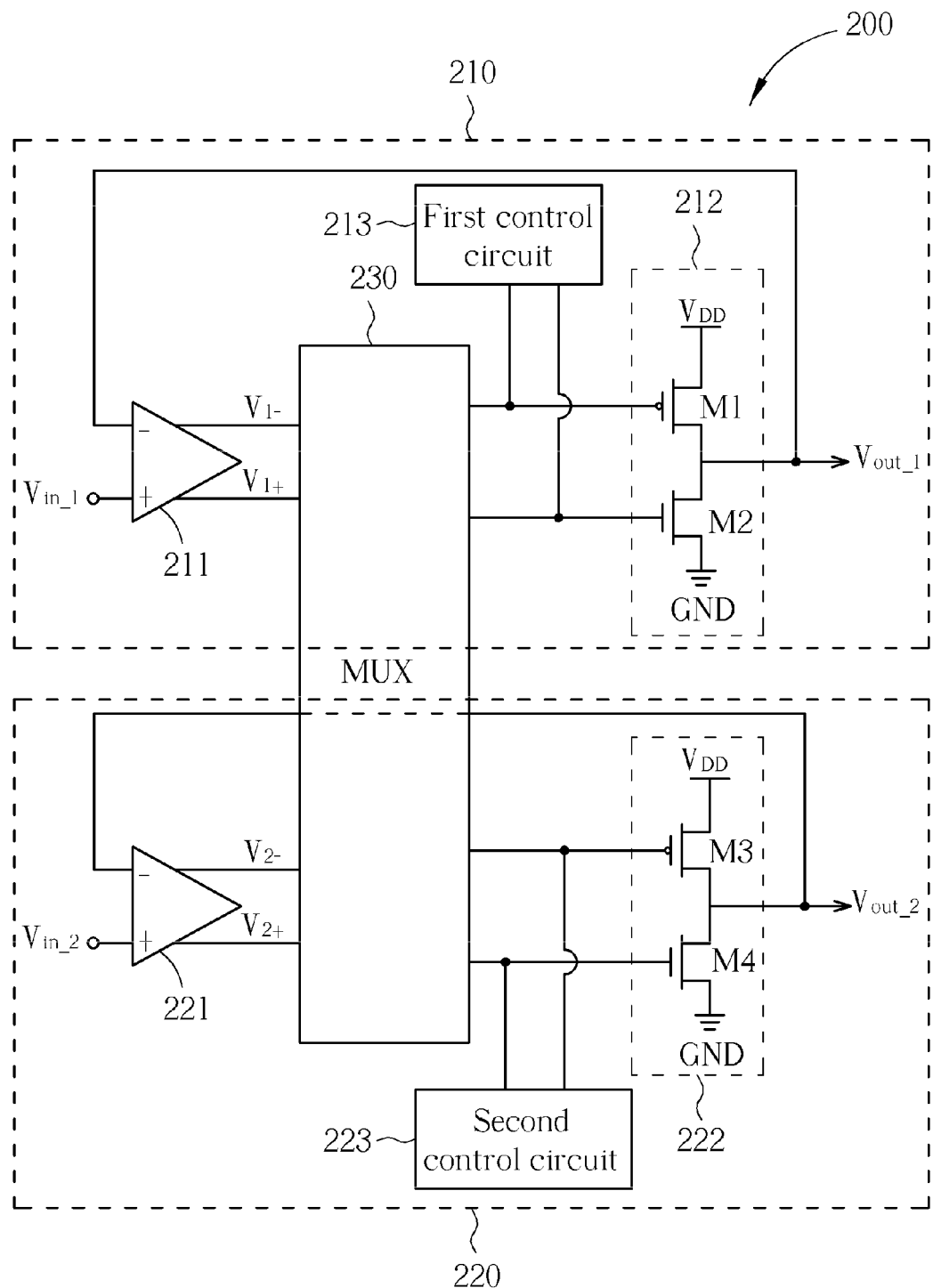
FIG. 2 is a diagram illustrating a source driver according to one embodiment of the present invention.

Please refer to FIG. 2. FIG. 2 is a diagram illustrating a source driver 200 according to one embodiment of the present invention. As shown in FIG. 2, the source driver includes a first channel 210, a second channel 220 and a multiplexer 230, where the first channel 210 includes a differential amplifier 211, an output stage 212 and a first control circuit 213; the second channel 220 includes a differential amplifier 221, an output stage 222 and a second control circuit 223. The output stage 212 includes two transistors M1 and M2 connected in a cascode formation, and the output stage 222 includes two transistors M3 and M4 connected in a cascode formation. In addition, the first channel 210 and the second channel 220 are adjacent channels, and are utilized for receiving input signals $V_{in\_1}$, $V_{in\_2}$ and generating output signals $V_{out\_1}$ and $V_{out\_2}$, respectively, to a pixel array (not shown). In addition, the source driver 200 is applied in an LCD apparatus.

In the operations of the source driver 200, first, the differential amplifier 211 receives a differential input signal pair to generate a differential output signal pair $V_{1+}$ and $V_{1-}$, and the differential amplifier 221 receives a differential input signal pair to generate a differential output signal pair $V_{2+}$ and $V_{2-}$. Then, during a first period, the multiplexer 230 is operated under a first configuration to transmit the differential output signal pair $V_{1+}$ and $V_{1-}$ to the output stage 212 and to transmit the differential output signal pair $V_{2+}$ and $V_{2-}$ to the output stage 222; and during a second period which is next to the first period and the output signals $V_{out\_1}$ and $V_{out\_2}$ need to be performed polarization inversion, the multiplexer 230 is operated under a second configuration to transmit the differential output signal pair $V_{1+}$ and $V_{1-}$ to the output stage 222 and to transmit the differential output signal pair $V_{2+}$ and $V_{2-}$ to the output stage 212. Finally, the output stage 212 receives the differential output signal pair from the multiplexer 230 to generate the output signal $V_{out\_1}$ to drive the corresponding pixel in the pixel array, and the output stage 222 receives the differential output signal pair from the multiplexer 230 to generate the output signal $V_{out\_2}$ to drive the corresponding pixel in the pixel array.

In addition, when a transfer pulse (TP) signal is enabled; i.e. the first channel 210 and the second channel 220 are blocked from outputting the output signal $V_{out\_1}$ and $V_{out\_2}$ to the pixel array, the first control circuit 213 disables the output stage 212 and the second control circuit 223 disables the output stage 222.

Figure 3:
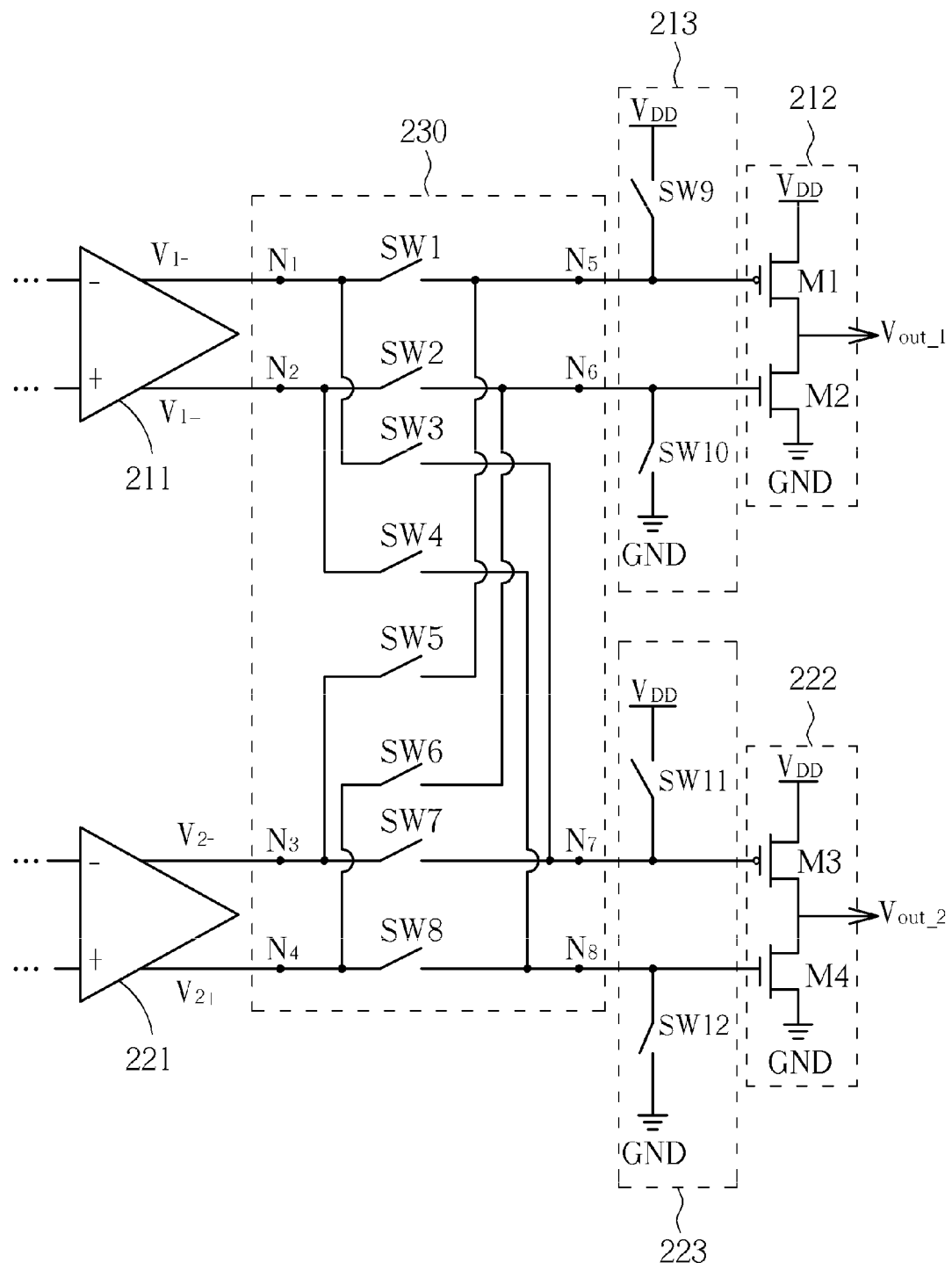
FIG. 3 is a circuit diagram of the multiplexer, the first control circuit and the second control circuit shown in FIG. 2

To understand the operations of the multiplexer 230, the first control circuit 213 and the second control circuit 223 more clearly, please refer to FIG. 3. FIG. 3 is a circuit diagram of the multiplexer 230, the first control circuit 213 and the second control circuit 223. As shown in FIG. 3, the multiplexer 230 includes a first input port (nodes $N_1$ and $N_2$) coupled to the differential amplifier 211, a second input port (nodes $N_3$ and $N_4$) coupled to the differential amplifier 211, a first output port (nodes $N_5$ and $N_6$) coupled to the output stage 212, a second output port (nodes $N_7$ and $N_8$) coupled to the output stage 222, and eight switches SW1-SW8. The first control circuit 213 includes a switch SW9 coupled between a voltage supply $V_{DD}$ and a gate electrode of the transistor M1, and a switch SW10 coupled between a ground voltage GND and a gate electrode of the transistor M2. The second control circuit 223 includes a switch SW11 coupled between the voltage supply $V_{DD}$ and a gate electrode of the transistor M3, and a switch SW12 coupled between the ground voltage GND and a gate electrode of the transistor M4. In addition, the switches SW1-SW12 can be implemented by NMOS, PMOS, transmission gates or other types of switches.

During the first period, the multiplexer 230 is operated under the first configuration, the switches SW1, SW2, SW7 and SW8 are switched on and the switches SW3-SW6 are switched off, so the first input port ($N_1$ and $N_2$) is coupled to the first output port ($N_5$ and $N_6$), the second input port ($N_3$ and $N_4$) is coupled to the second output port ($N_7$ and $N_8$), the differential output signal pair $V_{1+}$ and $V_{1-}$ is therefore transmitted to the output stage 212, and the differential output signal pair $V_{2+}$ and $V_{2-}$ is therefore transmitted to the output stage 222. During the second period which is next to the first period and the output signals $V_{out\_1}$ and $V_{out\_2}$ need to be performed polarization inversion, the multiplexer 230 is operated under the second configuration, the switches SW1, SW2, SW7 and SW8 are switched off and the switches SW3-SW6 are switched on, so the first input port ($N_1$ and $N_2$) is coupled to the second output port ($N_7$ and $N_8$), the second input port ($N_3$ and $N_4$) is coupled to the first output port ($N_5$ and $N_6$), the differential output signal pair $V_{1+}$ and $V_{1-}$ is therefore transmitted to the output stage 222, and the differential output signal pair $V_{2+}$ and $V_{2-}$ is therefore transmitted to the output stage 212.

In addition, when the transfer pulse (TP) signal is enabled, the switches SW9-SW12 are switched on. This means the transistors M1-M4 are turned off to block the first channel 210 and the second channel 220 from outputting the output signals $V_{out\_1}$ and $V_{out\_2}$.

Figure 4:
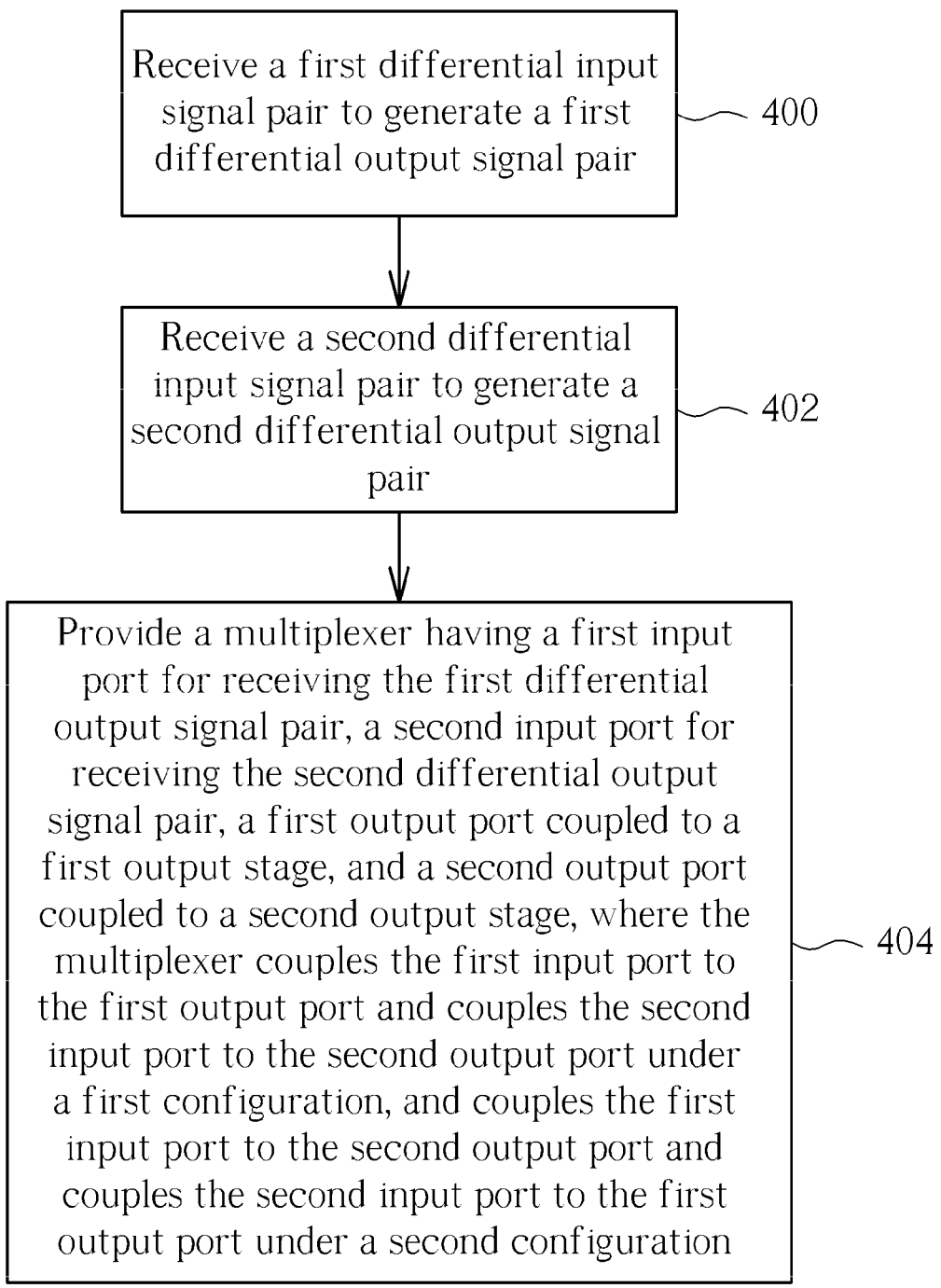
FIG. 4 is a simplified flowchart of a driving method of a source driver according to one embodiment of the present invention.

Please refer to FIG. 4. FIG. 4 is a simplified flowchart of a driving method of a source driver according to one embodiment of the present invention. It is noted that, provided the result is substantially the same, the steps are not limited to be executed according to the exact order shown in FIG. 4. Referring to the flowchart shown in FIG. 4, the driving method is as follows:

Step 400: Receive a first differential input signal pair to generate a first differential output signal pair.

Step 402: Receive a second differential input signal pair to generate a second differential output signal pair Step 404: Provide a multiplexer having a first input port for receiving the first differential output signal pair, a second input port for receiving the second differential output signal pair, a first output port coupled to a first output stage, and a second output port coupled to a second output stage, where the multiplexer couples the first input port to the first output port and couples the second input port to the second output port under a first configuration, and couples the first input port to the second output port and couples the second input port to the first output port under a second configuration.

Briefly summarized, in the source driver and the driving method of the associated driving method of the source driver, because the multiplexer is positioned between the differential amplifiers and the output stages, the driving ability is improved without increasing the chip area of the multiplexer. The manufacturing cost is therefore decreased.

Those skilled in the art will readily observe that numerous modifications and alterations of the device and method may be made while retaining the teachings of the invention.

What is claimed is:

1. A source driver, comprising:
   a first channel, comprising:
      a first differential amplifier, for receiving a first differential input signal pair to generate a first differential output signal pair;
      a first output stage; and
      a first control circuit, coupled to the first output stage, for selectively disabling the first output stage to make the first output stage not output data to a pixel array;
   a second channel, comprising:
      a second differential amplifier, for receiving a second differential input signal pair to generate a second differential output signal pair;
      a second output stage; and
      a second control circuit, coupled to the second output stage, for selectively disabling the second output stage to make the second output stage not output data to the pixel array; and
   a multiplexer, having a first input port coupled to the first differential amplifier for receiving the first differential output signal pair, a second input port coupled to the second differential amplifier for receiving the second differential output signal pair, a first output port coupled to the first output stage, and a second output port coupled to the second output stage, wherein the multiplexer couples the first input port to the first output port and couples the second input port to the second output port under a first configuration, and couples the first input port to the second output port and couples the second input port to the first output port under a second configuration.

2. The source driver of claim 1, wherein the first channel is immediately adjacent to the second channel.

3. The source driver of claim 1, wherein during a first period, the multiplexer is operated under the first configuration to transmit the first differential output signal pair to the first output stage and transmit the second differential output signal pair to the second output stage; and during a second period which is next to the first period and at which output signals of the first and second output stages need to be performed polarization inversion, the multiplexer is operated under the second configuration to transmit the first differential output signal pair to the second output stage and transmit the second differential output signal pair to the first output stage.

4. The source driver of claim 1, wherein when a transfer pulse signal is enabled, the first control circuit disables the first output stage.

5. The source driver of claim 4, wherein when the transfer pulse signal is enabled, the second control circuit disables the second output stage.

6. The source driver of claim 1, wherein the source driver is applied in a liquid crystal display apparatus.

7. A driving method of a source driver, comprising:
receiving a first differential input signal pair to generate a first differential output signal pair;
receiving a second differential input signal pair to generate a second differential output signal pair;
providing a multiplexer having a first input port for receiving the first differential output signal pair, a second input port for receiving the second differential output signal pair, a first output port coupled to a first output stage, and a second output port coupled to a second output stage, wherein the multiplexer couples the first input port to the first output port and couples the second input port to the second output port under a first configuration, and couples the first input port to the second output port and couples the second input port to the first output port under a second configuration;
selectively disabling the first output stage to make the first output stage not output data to a pixel array; and
selectively disabling the second output stage to make the second output stage not output data to the pixel array.

8. The driving method of claim 7, wherein during a first period, the multiplexer is operated under the first configuration to transmit the first differential output signal pair to the first output stage and transmit the second differential output signal pair to the second output stage; and during a second period which is next to the first period and at which output signals of the first and second output stages need to be performed polarization inversion, the multiplexer is operated under the second configuration to transmit the first differential output signal pair to the second output stage and transmit the second differential output signal pair to the first output stage.

9. The driving method of claim 7, the driving method further comprises: disabling the first output stage when a transfer signal is enabled.

10. The driving method of claim 9, the driving method further comprises: disabling the second output stage when the transfer signal is enabled.

11. The driving method of claim 7, the driving method further comprises: being applied in a liquid crystal display apparatus.

* * * * *